United States Patent
Tarui et al.

(10) Patent No.: US 9,547,551 B2
(45) Date of Patent: Jan. 17, 2017

(54) MEMORY SYSTEM HAVING AN ENCODING PROCESSING CIRCUIT FOR REDUNDANT ENCODING PROCESS

(71) Applicant: KABUSHIKI KAISHA TOSHIBA, Minato-ku, Tokyo (JP)

(72) Inventors: Masaya Tarui, Kanagawa (JP); Tatsunori Kanai, Kanagawa (JP); Yutaka Yamada, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/789,090

(22) Filed: Jul. 1, 2015

(65) Prior Publication Data
US 2015/0301892 A1 Oct. 22, 2015

Related U.S. Application Data

(60) Division of application No. 13/157,396, filed on Jun. 10, 2011, now Pat. No. 9,105,358, which is a
(Continued)

(30) Foreign Application Priority Data

Dec. 11, 2008 (JP) .................. 2008-315459

(51) Int. Cl.
*G06F 11/08* (2006.01)
*G06F 11/10* (2006.01)
(Continued)

(52) U.S. Cl.
CPC .......... *G06F 11/1076* (2013.01); *G06F 3/064* (2013.01); *G06F 3/0619* (2013.01); *G06F 3/0673* (2013.01);
(Continued)

(58) Field of Classification Search
CPC ....... G11C 29/42; H03M 13/19; H03M 13/09; H03M 13/1108; H03M 13/1111; H03M 5/145; G06F 11/1666; G06F 2212/403; G06F 11/1048; G06F 11/1076; G06F 11/08
(Continued)

(56) References Cited

U.S. PATENT DOCUMENTS 5,428,630 A 6/1995 Weng et al.
5,864,569 A * 1/1999 Roohparvar ........ G06F 11/1072
365/185.03
(Continued)

FOREIGN PATENT DOCUMENTS

JP 01-108655 4/1989
JP 01-295349 11/1989
(Continued)

OTHER PUBLICATIONS

International Search Report for Application No. PCT/JP2009/070702 mailed on Mar. 9, 2010.
(Continued)

*Primary Examiner* — James C Kerveros
(74) *Attorney, Agent, or Firm* — Amin, Turocy & Watson, LLP

(57) ABSTRACT

A memory system includes an encoding processing circuit configured to perform redundant encoding process on target data for generating data and a memory for writing the generated data by the encoding processing circuit, where a number of bits having a predetermined value are half or less than a total number of bits of the generated data.

5 Claims, 17 Drawing Sheets

Related U.S. Application Data continuation of application No. PCT/JP2009/070702, filed on Dec. 10, 2009.

(51) Int. Cl.
    *G06F 11/16*     (2006.01)
    *G06F 3/06*     (2006.01)
    *G11C 29/42*     (2006.01)
    *H03M 13/19*     (2006.01)

(52) U.S. Cl.
CPC ............ *G06F 11/1012* (2013.01); *G11C 29/42* (2013.01); *G06F 11/08* (2013.01); *G06F 11/1048* (2013.01); *G06F 11/1666* (2013.01); *H03M 13/19* (2013.01)

(58) Field of Classification Search
USPC ........................................ 714/755, 758, 763
See application file for complete search history.

(56) References Cited

U.S. PATENT DOCUMENTS

| | | | |
|---|---|---|---|
| 6,300,886 B1 | 10/2001 | Hayami | |
| 6,363,513 B1 | 3/2002 | Hekstra | |
| 7,020,811 B2 * | 3/2006 | Byrd | H04L 1/004 714/52 |
| 7,353,448 B1 | 4/2008 | Barash | |
| 8,010,865 B2 | 8/2011 | Gu et al. | |
| 8,196,016 B1 | 6/2012 | Langner et al. | |
| 8,443,256 B2 | 5/2013 | Shafai et al. | |
| 8,593,855 B2 * | 11/2013 | Onishi | G06F 11/1048 365/148 |
| 9,105,358 B2 * | 8/2015 | Tarui | G06F 11/1012 |
| 2001/0025359 A1 * | 9/2001 | Tanaka | G06F 11/10 714/753 |
| 2004/0003336 A1 * | 1/2004 | Cypher | G11C 29/42 714/763 |
| 2009/0319865 A1 | 12/2009 | Kanai et al. | |
| 2009/0319867 A1 | 12/2009 | Kanai | |
| 2014/0164873 A1 * | 6/2014 | Guyot | G06F 11/08 714/764 |

FOREIGN PATENT DOCUMENTS

| | | |
|---|---|---|
| JP | 07-334991 | 12/1995 |
| JP | 2000-332613 | 11/2000 |
| JP | 2004-152366 | 5/2004 |
| JP | 2007-299436 | 11/2007 |

OTHER PUBLICATIONS

Non-Final Office Action for U.S. Appl. No. 13/157,936 dated Sep. 20, 2013, 27 pages.
Final Office Action for U.S. Appl. No. 13/157,396 dated Feb. 11, 2014, 13 pages.
Non-Final Office Action for U.S. Appl. No. 13/157,396 dated Dec. 18, 2014, 18 pages.
International Preliminary Report on Patentability for International Application No. PCT/JP2009/070702 issued on Jul. 5, 2011.
Written Opinion for International Application No. PCT/JP2009/070702.
Japanese Office Action for Japanese Application No. 2013-113239 mailed on Feb. 7, 2014.
Japanese Office Action for Japanese Application No. 2008-315459 mailed on Feb. 5, 2013.

* cited by examiner $x'_0 = 0$
$x'_1 = 0 \oplus d_0$
$x'_2 = 0 \oplus d_0 \oplus d_1$
$x'_3 = 0 \oplus d_0 \oplus d_1 \oplus d_2$
$x'_4 = 0 \oplus d_0 \oplus d_1 \oplus d_2 \oplus d_3$
$x'_5 = 0 \oplus d_0 \oplus d_1 \oplus d_2 \oplus d_3 \oplus d_4$
$x'_6 = 0 \oplus d_0 \oplus d_1 \oplus d_2 \oplus d_3 \oplus d_4 \oplus d_5$
$x'_7 = 0 \oplus d_0 \oplus d_1 \oplus d_2 \oplus d_3 \oplus d_4 \oplus d_5 \oplus d_6$
$x'_8 = 0 \oplus d_0 \oplus d_1 \oplus d_2 \oplus d_3 \oplus d_4 \oplus d_5 \oplus d_6 \oplus d_7$ $x = x' \oplus s$ $s =$ IF NUMBER OF 1 INCLUDED IN $x' > 4$
        then  111111111B
        else  000000000B $d_0 = x_0 \oplus x_1$
$d_1 = x_1 \oplus x_2$
$d_2 = x_2 \oplus x_3$
$d_3 = x_3 \oplus x_4$
$d_4 = x_4 \oplus x_5$
$d_5 = x_5 \oplus x_6$
$d_6 = x_6 \oplus x_7$
$d_7 = x_7 \oplus x_8$

| INPUT | OUTPUT | INPUT | OUTPUT |
|-------|--------|-------|--------|
| 0000 | 00_0000 | 1000 | 00_0101 |
| 0001 | 00_0001 | 1001 | 00_1001 |
| 0010 | 00_0010 | 1010 | 01_0001 |
| 0011 | 00_0100 | 1011 | 10_0001 |
| 0100 | 00_1000 | 1100 | 00_0110 |
| 0101 | 01_0000 | 1101 | 00_1010 |
| 0110 | 10_0000 | 1110 | 01_0010 |
| 0111 | 00_0011 | 1111 | 10_0010 |

$$\begin{pmatrix} 1 & 1 & 0 & 1 & 0 & 1 & 0 & 1 & 1 & 0 & 0 & 0 \\ 1 & 0 & 1 & 1 & 0 & 0 & 1 & 1 & 0 & 1 & 0 & 0 \\ 1 & 0 & 0 & 0 & 1 & 1 & 1 & 1 & 0 & 0 & 1 & 0 \\ 0 & 1 & 1 & 1 & 1 & 1 & 1 & 1 & 0 & 0 & 0 & 1 \end{pmatrix}$$

$$\begin{pmatrix} 1 & 0 & 0 & 0 & 0 & 0 & 0 & 0 & 1 & 1 & 0 & 0 \\ 0 & 1 & 0 & 0 & 0 & 0 & 0 & 0 & 1 & 0 & 1 & 0 \\ 0 & 0 & 1 & 0 & 0 & 0 & 0 & 0 & 0 & 1 & 1 & 0 \\ 0 & 0 & 0 & 1 & 0 & 0 & 0 & 0 & 1 & 1 & 1 & 0 \\ 0 & 0 & 0 & 0 & 1 & 0 & 0 & 0 & 1 & 0 & 0 & 1 \\ 0 & 0 & 0 & 0 & 0 & 1 & 0 & 0 & 0 & 1 & 0 & 1 \\ 0 & 0 & 0 & 0 & 0 & 0 & 1 & 0 & 1 & 1 & 0 & 1 \\ 0 & 0 & 0 & 0 & 0 & 0 & 0 & 1 & 0 & 0 & 1 & 1 \\ 1 & 1 & 1 & 1 & 1 & 1 & 1 & 1 & 0 & 1 & 1 & 1 \end{pmatrix}$$

$$\begin{pmatrix}d_0\\d_1\\d_2\\d_3\\d_4\\d_5\\s_0\\s_1\end{pmatrix}^T \cdot \begin{pmatrix}1&1&1&1&1&1&0&0\\0&1&1&1&1&1&0&0\\0&0&1&1&1&1&0&0\\0&0&0&1&1&1&0&0\\0&0&0&0&1&1&0&0\\0&0&0&0&0&1&0&0\\1&0&1&0&1&0&1&0\\1&1&1&1&1&1&1&1\end{pmatrix} = \begin{pmatrix}x_0\\x_1\\x_2\\x_3\\x_4\\x_5\\x_6\\x_7\end{pmatrix}^T$$

INPUT · REDUNDANT CODE GENERATION MATRIX = OUTPUT

FIG.29

MEMORY SYSTEM HAVING AN ENCODING PROCESSING CIRCUIT FOR REDUNDANT ENCODING PROCESS

CROSS-REFERENCE TO RELATED APPLICATIONS

This application is a Division of co-pending U.S. patent application Ser. No. 13/157,396, filed on Jun. 10, 2011, which is a Continuation of PCT International Patent Application Serial No. PCT/JP2009/070702, filed on Dec. 10, 2009, which is based upon and claims the benefit of priority from prior Japanese Patent Application No. 2008-315459, filed on Dec. 11, 2008, the entire contents of all of which are incorporated herein by reference.

TECHNICAL FIELD

The invention relates to a memory system.

BACKGROUND ART

In high-density memory chips, with a decrease in the size of material constituting individual memory cells (1-bit memory elements), the probability (error rate) that the content of a memory cell is changed to be different from the original content to be stored increases due to fluctuation of characteristics resulting from processing accuracy during manufacturing, or an increase in the influence of disturbance such as temperature, electromagnetic waves, and the like.

As countermeasures to this error, in addition to a method of just increasing the processing accuracy or protecting the memory cells so as to decrease the influence of disturbance, a method of correcting error bits using an error correction code (ECC) is known. The error rate may be caused by the device characteristics of memories in addition to disturbance.

Like MRAMs, RRAMs, or ReRAMs, in electrically rewritable memories using memory cells capable of having two different resistance values, by putting the memory cells into any one of a low-resistance state and a high-resistance state, data are stored so that one resistance state corresponds to a logical value of 0 and the other resistance state corresponds to a logical value of 1. When reading data, the logical value is determined to be 0 or 1 (or 1 or 0) depending on whether the resistance value of a memory cell is smaller or larger than a threshold value.

In such a memory, since it is not possible to directly measure the resistance value during reading, by applying a constant voltage to a memory cell to measure a current value or by flowing a constant current to measure a voltage value, a resistance value is estimated and a logical value is determined.

For example, in MRAMs, the same operation is performed between writing and reading, and reading is performed with intensity such that the content of a memory is not changed. For example, when reading data, a current flows in the same direction as when writing the data of 0, and whether the data is 0 or 1 is determined based on the resistance value at that time.

At this time, the content of a memory which is 1 may be altered to 0. This is called read disturbance, which is affected by fluctuation of the characteristics of a memory cell, and which is a major cause of an increase in the error rate of MRAMs. If the probability (read disturbance probability) of the occurrence of this read disturbance increases, there is a problem in that it is not possible to correct all error bits using the conventional error correction code.

As a technique of preventing destruction of data written to a memory, a nonvolatile semiconductor memory device is proposed in which the number of data "1" in the written data is counted, inverted data of the written data are written to a normal memory portion when the number of data "1" is half or more than the number of bits of the written data, and information indicating the inversion is written to an auxiliary word memory portion, thereby suppressing drain disturb (for example, see Patent Document 1). When reading data from the normal memory portion, data are read from the auxiliary word memory portion to determine whether data was inverted during writing. If data was inverted, the data read from the normal memory portion is inverted and output.

However, since it is necessary to read information indicating whether data is inverted or not from the auxiliary word memory portion whenever data is read, there is a problem in that the reading process is complicated, and the memory access time increases.

CITATION LIST

Patent Document

Patent Document 1: Japanese Patent Application Laid-Open No. 7-334991

DISCLOSURE OF THE INVENTION

Problem to be Solved by the Invention

An object of the invention is to provide a memory system that suppresses an increase in the access time and decreases the read disturbance probability.

Means for Solving the Problem

A memory system according to an aspect of the invention includes an encoding processing circuit that performs redundant encoding process on target data to be written to thereby generate data such that the number of bits having a predetermined value is half or less than the total number of bits; and a memory to which the data generated by the encoding processing circuit is written.

Effect of the Invention

According to the invention, it is possible to suppress an increase in the access time and to decrease the read disturbance probability.

BRIEF DESCRIPTION OF THE DRAWINGS

FIG. 29 is a mathematical expression illustrating an example of a redundant encoding process.

BEST MODE(S) FOR CARRYING OUT THE INVENTION

Hereinafter, embodiments of the invention will be described based on the drawings.

(First Embodiment)

Figure 1:
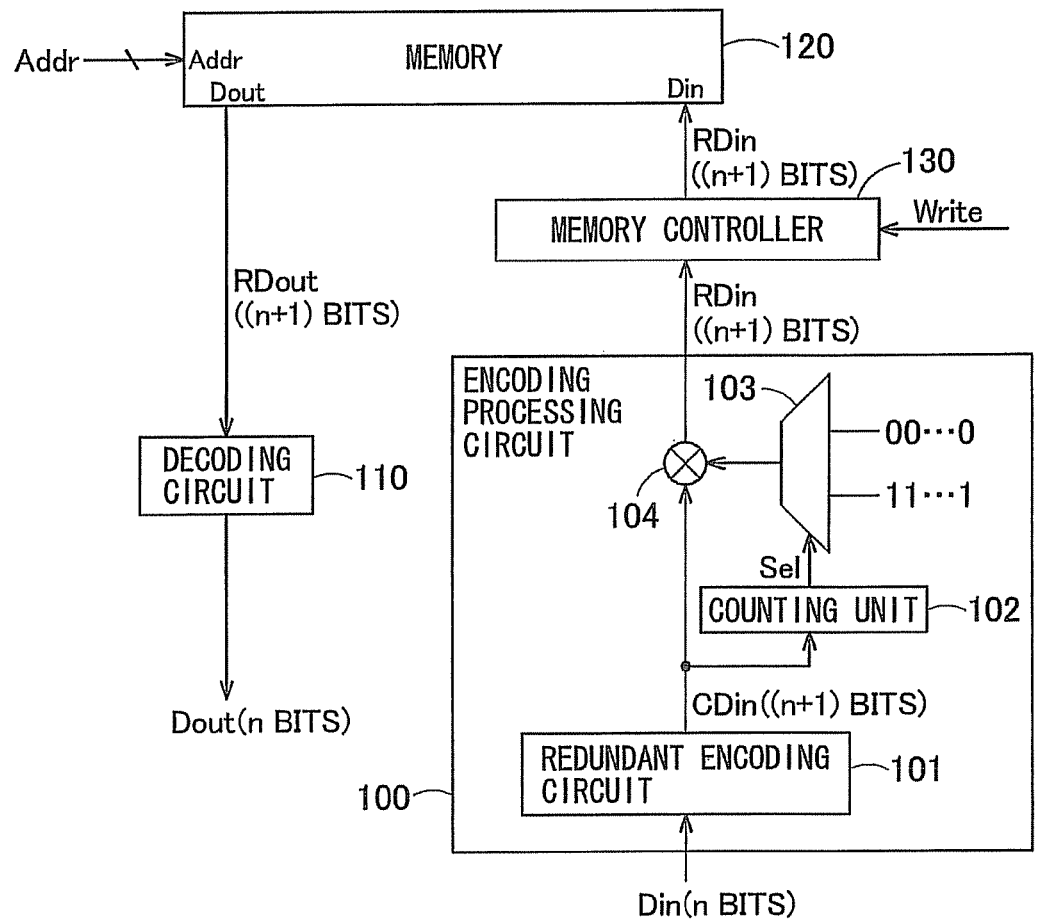
FIG. 1 is a schematic configuration diagram of a memory system according to a first embodiment of the invention.

FIG. 1 illustrates a schematic configuration of a memory system according to a first embodiment of the invention. The memory system includes an encoding processing circuit 100, a decoding circuit 110, a memory 120, and a memory controller 130. The encoding processing circuit 100 includes a redundant encoding circuit 101, a counting unit 102, a selector 103, and an arithmetic unit 104.

The redundant encoding circuit 101 receives n-bit (n is an integer of 1 or more) target data Din to be written to the memory 120 and performs redundant encoding process on the data Din to convert the data Din into (n+1)-bit data CDin and output the data CDin. The redundant encoding process will be described later. The selector 103 receives (n+1)-bit data 11 . . . 1 and 00 . . . 0 and selects and outputs any one of the (n+1)-bit data based on a selection signal Sel output from the counting unit 102.

The counting unit 102 counts the number of bits having the value 1 among the data CDin generated by the redundant encoding circuit 101 and generates and outputs the selection signal Sel based on the count value. When the count value is more than (n+1)/2, the counting unit 102 outputs a selection signal Sel such that the selector 103 selects the data 11 . . . 1. Moreover, when the count value is (n+1)/2 or less, the counting unit 102 outputs a selection signal Sel such that the selector 103 selects the data 00 . . . 0.

The arithmetic unit 104 performs an XOR operation on the respective bits of the (n+1)-bit data generated by the redundant encoding circuit 101 and the (n+1)-bit data 11 . . . 1 or 00 . . . 0 selected by the selector 103 to generate and output (n+1)-bit data RDin.

The memory 120 is a random accessible nonvolatile memory and receives a multi-bit address signal Addr that designates a memory address in which writing or reading is performed. The memory controller 130 receives a write signal Write indicating a write timing and the data RDin generated by the encoding processing circuit 100 (the arithmetic unit 104) and writes the data RDin to the address of the memory 120 designated by the address signal Addr at the timing based on the write signal Write. The memory 120 is a MRAM, for example.

The decoding circuit 110 receives (n+1)-bit data RDout read from the memory 120 and performs a decoding process on the data RDout to convert the data RDout into n-bit data Dout and output the data Dout.

Figure 2:
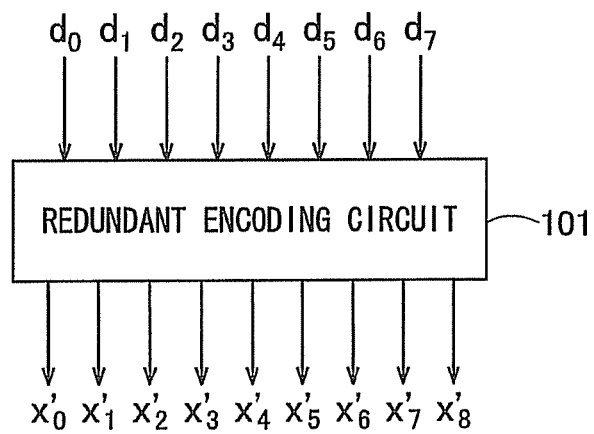
FIG. 2 is a diagram illustrating an example of processing by a redundant encoding circuit.

The redundant encoding process and the decoding process will be described by way of an example of n=8. As illustrated in FIG. 2, the redundant encoding circuit 101 receives 8-bit data $d_0$, $d_1$, $d_2$, $d_3$, $d_4$, $d_5$, $d_6$, and $d_7$ and performs a redundant encoding process on the data to output 9-bit data $x'_0$, $x'_1$, $x'_2$, $x'_3$, $x'_4$, $x'_5$, $x'_6$, $x'_7$, and $x'_8$.

Figures 3, 4:
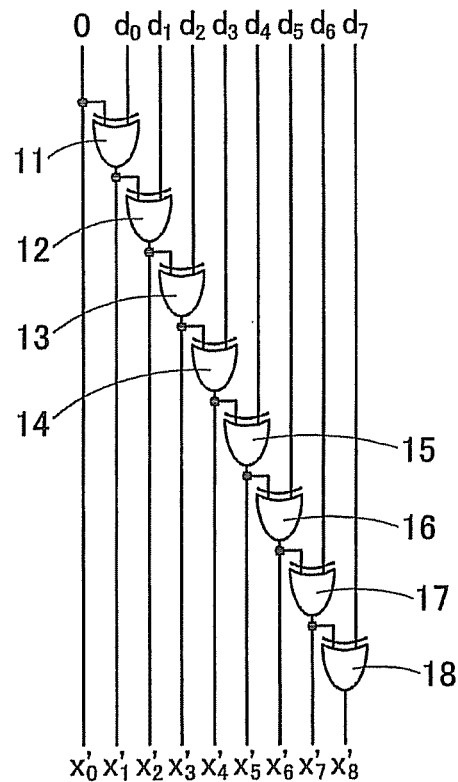
FIG. 3 is a logical expression illustrating an example of a redundant encoding process.
FIG. 4 is a circuit diagram illustrating an example of a redundant encoding circuit.

The redundant encoding process can be expressed by a logical expression as illustrated in FIG. 3, and the redundant encoding circuit 101 can be configured by a logical circuit having XOR elements 11 to 18 as illustrated in FIG. 4. 0 is output as the $x'_0$ bit of the output data. The XOR element 11 receives 0 and the $d_0$ bit and the output thereof becomes the $x'_1$ bit.

The XOR element 12 receives the output of the XOR element 11 and the $d_1$ bit and the output thereof becomes the $x'_2$ bit. Similarly, the XOR element k (13≤k≤18) receives the output of the XOR element k−1 and the bit $d_{k-11}$ and the output thereof becomes the $x'_{k-10}$ bit.

Figures 5, 6, 7:
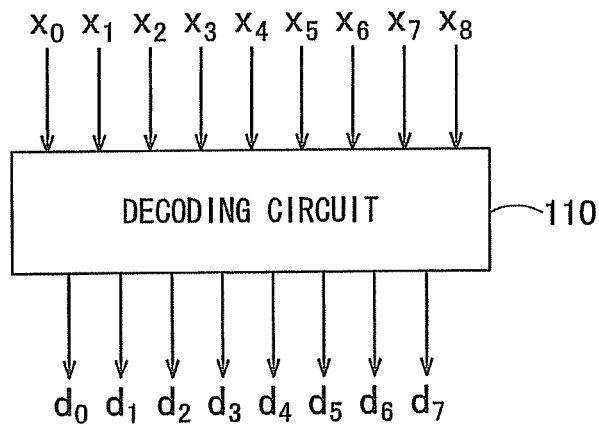
FIG. 5 is a mathematical expression illustrating an example of arithmetic processing on redundant data.
FIG. 6 is a diagram illustrating an example of processing by a decoding circuit.
FIG. 7 is a logical expression illustrating an example of a decoding process.

The processing by the counting unit 102, the selector 103, and the arithmetic unit 104 can be expressed by a logical expression as illustrated in FIG. 5. When the number of bits having the value 1 among the 9-bit data $x'_0$, $x'_1$, $x'_2$, $x'_3$, $x'_4$, $x'_5$, $x'_6$, $x'_7$, and $x'_8$ is more than 4, an XOR operation is performed on the respective bits of $x'_0$, $x'_1$, $x'_2$, $x'_3$, $x'_4$, $x'_5$, $x'_6$, $x'_7$, and $x'_8$ and 1, and the 9-bit data $x_0$, $x_1$, $x_2$, $x_3$, $x_4$, $x_5$, $x_6$, $x_7$, and $x_8$ are output.

When the number of bits having the value 1 among the 9-bit data $x'_0$, $x'_1$, $x'_2$, $x'_3$, $x'_4$, $x'_5$, $x'_6$, $x'_7$, and $x'_8$ is 4 or less, an XOR operation is performed on the respective bits of $x'_0$, $x'_1$, $x'_2$, $x'_3$, $x'_4$, $x'_5$, $x'_6$, $x'_7$, and $x'_8$ and 0, and the 9-bit data $x_0$, $x_1$, $x_2$, $x_3$, $x_4$, $x_5$, $x_6$, $x_7$, and $x_8$ are output.

That is, when the number of bits having the value 1 among the 9-bit data output from the redundant encoding circuit 101 is more than 4 (5 or more), the respective bits are inverted and output. When the number of bits having the value 1 is 4 or less, the respective bits are output without inversion.

As illustrated in FIG. 6, the decoding circuit 110 receives the 9-bit data $x_0$, $x_1$, $x_2$, $x_3$, $x_4$, $x_5$, $x_6$, $x_7$, and $x_8$ read from the memory 120 and performs a decoding process on the data to output 8-bit data $d_0$, $d_1$, $d_2$, $d_3$, $d_4$, $d_5$, $d_6$, and $d_7$.

Figure 8:
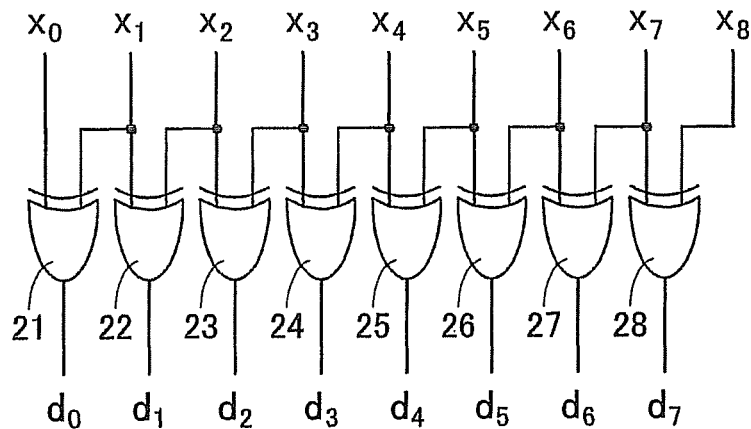
FIG. 8 is a circuit diagram illustrating an example of a decoding circuit.

The decoding process can be expressed by a logical expression as illustrated in FIG. 7, and the decoding circuit 110 can be configured by a logical circuit having XOR elements 21 to 28 as illustrated in FIG. 8. The XOR element 21 receives the $x_0$ and $x_1$ bits and the output thereof becomes the d0 bit.

Similarly, the XOR element j ($22 \leq j \leq 28$) receives the $x_{j-21}$ and $x_{j-20}$ bits and the output thereof becomes the $d_{j-21}$ bit.

As understood from the logical expressions illustrated in FIGS. 3 and 7, it is possible to restore the original 8-bit data $d_0$, $d_1$, $d_2$, $d_3$, $d_4$, $d_5$, $d_6$, and $d_7$ by decoding the 9-bit data $x'_0$, $x'_1$, $x'_2$, $x'_3$, $x'_4$, $x'_5$, $x'_6$, $x'_7$, and $x'_8$ which are obtained through the redundant encoding process on the 8-bit data $d_0$, $d_1$, $d_2$, $d_3$, $d_4$, $d_5$, $d_6$, and $d_7$.

Moreover, it is also possible to restore the original 8-bit data $d_0$, $d_1$, $d_2$, $d_3$, $d_4$, $d_5$, $d_6$, and $d_7$ by inverting the respective bits of the 9-bit data $x'_0$, $x'_1$, $x'_2$, $x'_3$, $x'_4$, $x'_5$, $x'_6$, $x'_7$, and $x'_8$ and then performing a decoding process thereon.

For example, it is assumed that the 8-bit data is 01100011. When this value is input to the redundant encoding circuit illustrated in FIG. 4, 9-bit data 001000010 is output. When the data 001000010 is input to the redundant decoding circuit illustrated in FIG. 8, the output becomes 01100011, and the original data is restored.

Moreover, even when 110111101 obtained by inverting the respective bits of the 9-bit data 001000010 is input to the redundant decoding circuit illustrated in FIG. 8, the output becomes 01100011, and the original data is restored.

Therefore, when the selector 103 selects any one of 00 . . . 0 and 11 . . . 1, the data obtained by the decoding circuit 110 decoding the output data of the encoding processing circuit 100 becomes identical to the input data of the encoding processing circuit 100.

The encoding processing circuit 100 performs a redundant encoding process on n-bit input data to output (n+1)-bit data, and inverts and outputs the values of the respective bits of the output data when the number of bits having the value 1 among the (n+1) bits is more than (n+1)/2. That is, in the case of the output data RDin of the encoding processing circuit 100, written to the memory 120, the number of bits having the value 1 is half or more than the total number of bits, and the data has more 0-bits than 1-bits.

In general MRAMs, the direction of flowing a current when reading data is fixed by the device characteristics when designing the device. Thus, for example, if it is designed so that when reading data, a current flows in the same direction as when writing the data of 0, read disturbance occurs only when 1-bits are changed to 0-bits.

Therefore, when writing data to the memory 120, by writing the data such that the number of bits having the value 0 increases, the number of bits which are subject to read disturbance decreases, and the read disturbance probability decreases as a whole.

In the present embodiment, when the number of bits having the value 1 among the data CDin obtained through the redundant encoding process on the input data Din is more than half the total number of bits, the encoding processing circuit 100 inverts and writes the data CDin to the memory 120. Therefore, since data having more 0-bits than 1-bits are written to the memory 120 and the number of bits which are subject to read disturbance decreases, it is possible to decrease the read disturbance probability.

Moreover, since the decoding circuit 110 decodes the data read from the memory 120 regardless of whether the data RDin written to the memory 120 are obtained by inverting the data CDin which are obtained through the redundant encoding process, the same output data Dout as the input data Din of the encoding processing circuit 100 is obtained. Therefore, since it is not necessary to check whether the data written to the memory 120 are inverted, it is possible to reduce the memory access time during reading as compared to the case where such checking is necessary.

Figure 9:
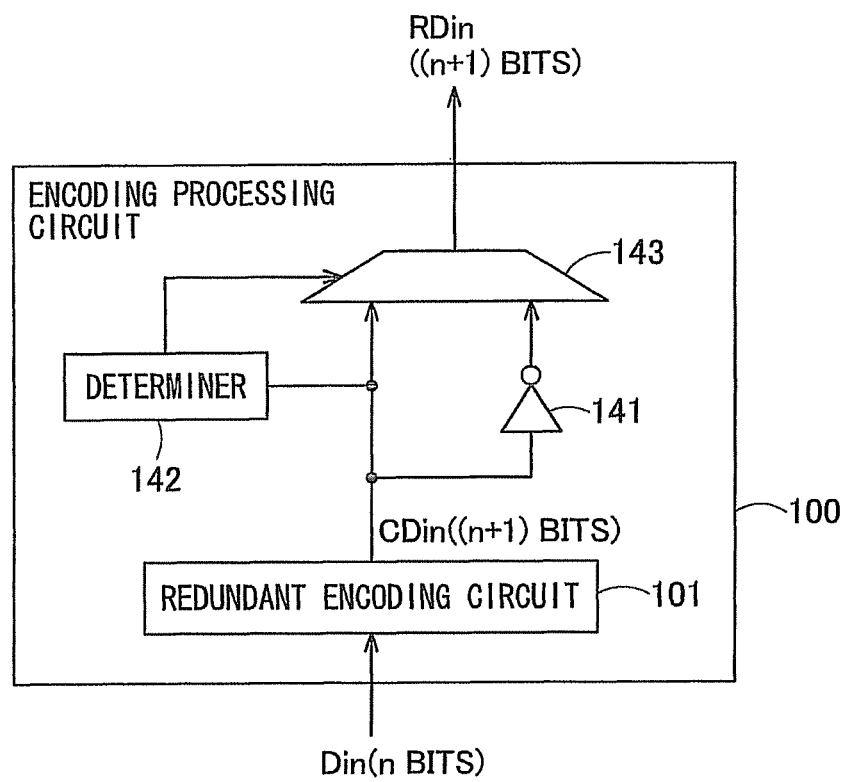
FIG. 9 is a schematic configuration diagram of an encoding processing circuit according to a modification.

The encoding processing circuit 100 of the first embodiment may be configured as illustrated in FIG. 9. The encoding processing circuit 100 includes the redundant encoding circuit 101, an inverter 141, a determiner 142, and a selector 143.

The inverter 141 inverts and outputs the respective bits of the (n+1)-bit output data CDin of the redundant encoding circuit 101. The determiner 142 counts the number of bits having the value 1 included in the output data CDin of the redundant encoding circuit 101 and output a selection signal to the selector 143 based on the count value. For example, when the count value is more than (n+1)/2, the determiner 142 output a selection signal such that the selector 143 selects the output of the inverter 141. In this way, the number of bits having the value 1 included in the output of the inverter 141 becomes (n+1)/2 or less.

The determiner 142 may count the number of bits having the value 0 and output a selection signal based on a value obtained by subtracting the count value from (n+1).

With such a configuration, data having more 0-bits than 1-bits are output from the encoding processing circuit 100, and it is possible to decrease the read disturbance probability in the memory 120.

In the first embodiment, the memory 120 is designed so that when reading data, a current flows in the same direction as when writing the data of 0, and read disturbance occurs when 1-bits are changed to 0-bits. Thus, the encoding processing circuit 100 inverts and outputs data so that 0-bits are more than 1-bits.

Therefore, when the memory 120 is designed so that when reading data, a current flows in the same direction as when writing the data of 1, and read disturbance occurs when 0-bits are changed to 1-bits, the encoding processing circuit 100 outputs data so that 1-bits are more than 0-bits.

For example, the counting unit 102 counts the number of bits having the value 0 among the data CDin output from the redundant encoding circuit 101 and output a selection signal Sel such that the selector 103 selects 11 . . . 1 when the count value is more than (n+1)/2.

(Second Embodiment)

Figures 10, 11:
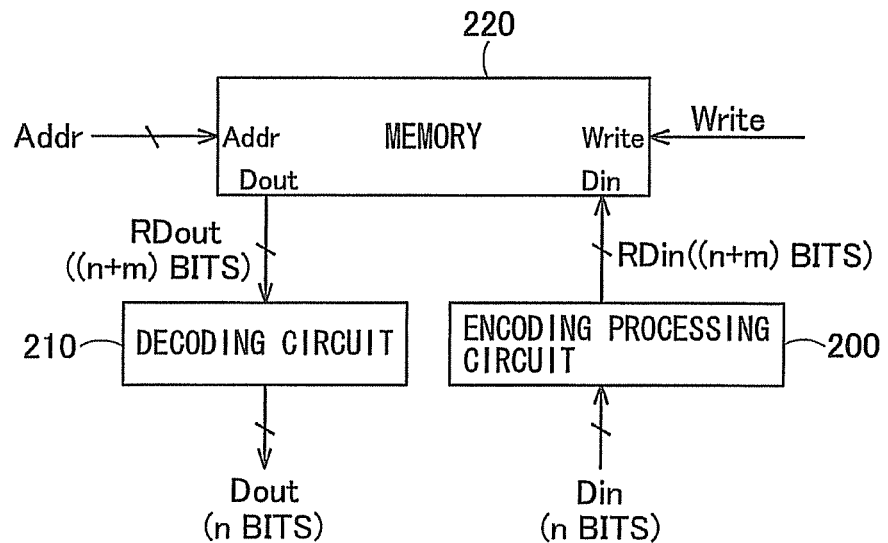
FIG. 10 is a schematic configuration diagram of a memory system according to a second embodiment of the invention.
FIG. 11 is a diagram illustrating an example of a biased encoding processing table.

FIG. 10 illustrates a schematic configuration of a memory system according to a second embodiment of the invention. The memory system includes an encoding processing circuit 200, a decoding circuit 210, and a memory 220. It is assumed that a memory controller (one equivalent to the memory controller 130 of the first embodiment) which writes data to the memory 220 is included in the memory 220.

The encoding processing circuit 200 includes a biased encoding processing table, converts n-bit input data Din into (n+m)-bit data RDin (m is an integer of 2 or more) by referencing the biased encoding processing table, and outputs the data RDin to the memory 220. Here, the biased encoding processing table is constructed so as to decrease the occurrence probability of values which are subject to read disturbance of the memory 220.

The decoding circuit 210 converts the (n+m)-bit data RDout read from the memory 220 into n-bit data Dout by referencing a decoding processing table in which the input/output relation is reversed from that of the biased encoding processing table and outputs the data Dout.

The first embodiment performs 1-bit redundant encoding, whereas the present embodiment performs 2-bit or more (m-bit) redundant encoding. This is because if the occurrence probabilities of 0 and 1 are the same, it is statistically true that 2-bit or more redundant encoding can better decrease the read disturbance probability than 1-bit redundant encoding.

FIG. 11 is an example of a biased encoding processing table when 4-bit input data are encoded into 6-bit data. This biased encoding processing table is one in which read disturbance occurs in the memory 220 when 1-bits are changed to 0-bits and which is constructed so that the occurrence probability of 1 decreases.

When the occurrence probabilities of 16 input data (0000 to 1111) are the same, the use of the biased encoding processing table enables decreasing the read disturbance probability by 4% as compared to the case of converting 4-bit input data into 5-bit data through redundant encoding.

As described above, by performing 2-bit or more redundant encoding using the biased encoding processing table so that the number of bits which are subject to read disturbance decreases and writing the encoding results to the memory, it is possible to further decrease the read disturbance probability.

Moreover, since the decoding circuit 210 restores the data read from the memory 220 to the original data using the decoding processing table and output the restored data, it is not necessary to check whether the data written to the memory 220 are inverted, and it is possible to suppress an increase in the memory access time.

(Third Embodiment)

Figure 12:
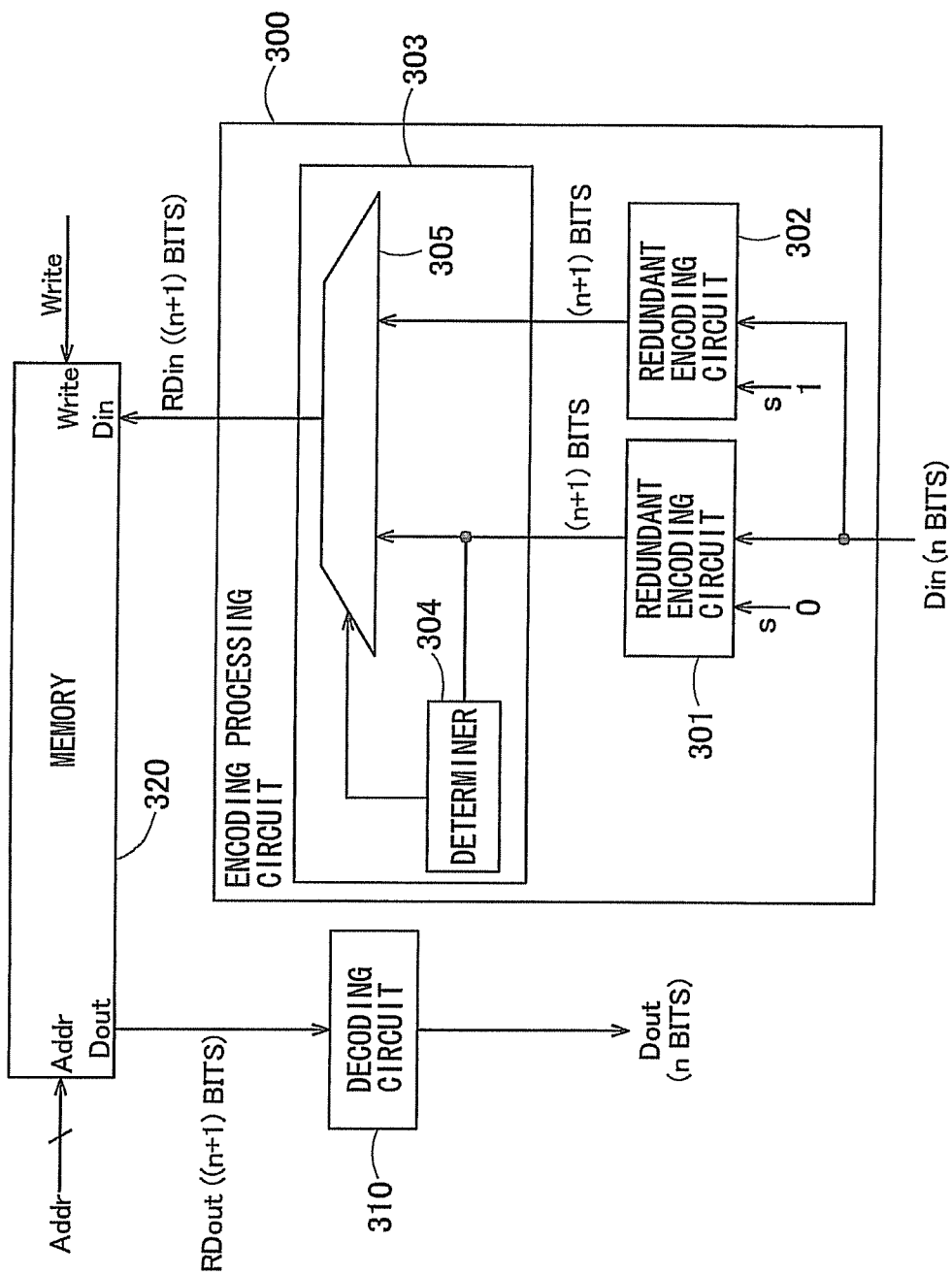
FIG. 12 is a schematic configuration diagram of a memory system according to a third embodiment of the invention.

FIG. 12 illustrates a schematic configuration of a memory system according to a third embodiment of the invention. The memory system includes an encoding processing circuit 300, a decoding circuit 310, and a memory 320. The encoding processing circuit 300 includes redundant encoding circuits 301 and 302 and a biased selector 303. It is assumed that a memory controller (one equivalent to the memory controller 130 of the first embodiment) which writes data to the memory 320 is included in the memory 320.

The redundant encoding circuits 301 and 302 scramble n-bit input data Din using mutually different 1-bit seed data s to output (n+1)-bit data maintaining information on the seed data s. The redundant encoding circuit 301 receives 0 as the seed data s and the redundant encoding circuit 302 receives 1 as the seed data s. The output of the redundant encoding circuit 301 and the output of the redundant encoding circuit 302 have a relation such that the values of the respective bits are inverted.

The biased selector 303 includes a determiner 304 and a selector 305. The determiner 304 monitors the output data of the redundant encoding circuit 301, determines which one of the output data of the redundant encoding circuits 301 and 302 has fewer bits which are subject to read disturbance of the memory 320, and outputs a selection signal to the selector 305 so as to select such data.

That is, the biased selector 303 selects one of the output data of the redundant encoding circuits 301 and 302, which has fewer bits which are subject to read disturbance of the memory 320 and outputs the selected output data to the memory 320.

The decoding circuit 310 decodes the (n+1)-bit data RDout read from the memory 320. At this time, although the information on the seed data s is also decoded, the decoding circuit 310 outputs n-bit data Dout while discarding the seed data s.

Figure 13:
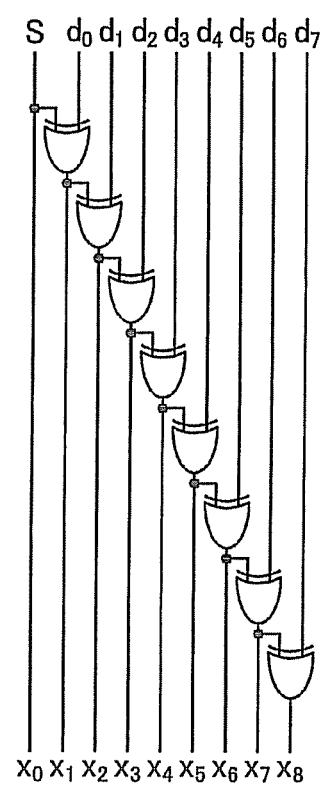
FIG. 13 is a diagram illustrating an example of a redundant encoding circuit according to the third embodiment.

FIG. 13 illustrates a configuration example of a logical circuit of the redundant encoding circuits 301 and 302 when n=8. In this example, the $x_0$-bit of the 9-bit output data has the same value as the seed data s. If the input data is 01100011, the output of the redundant encoding circuit 301 becomes 001000010 and the output of the redundant encoding circuit 302 becomes 110111101.

Here, for example, if 1-bits are subject to read disturbance of the memory 320, the biased selector 303 selects 001000010 and writes the data to the memory 320.

When the data 001000010 is input to the decoding circuit 310, the decoding circuit 310 outputs data in which the seed data is 0 and the body is 01100011, and the original input data is obtained.

Figure 14:
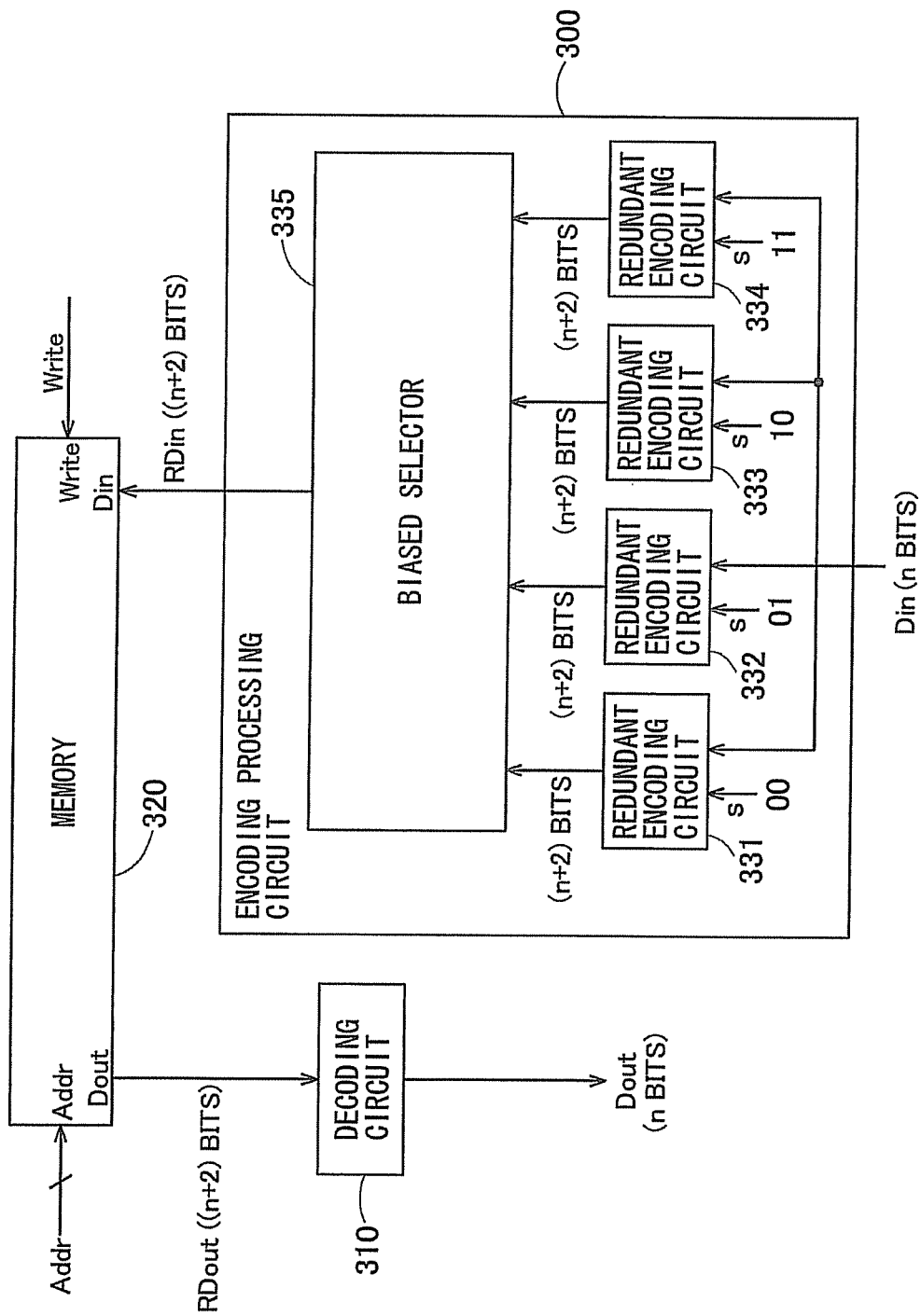
FIG. 14 is a schematic configuration diagram of a memory system according to a modification.

The seed data s may have 2 bits or more rather than 1 bit. When the seed data has p bits (p is an integer of 2 or more), $2^p$ redundant encoding circuits are provided and different seed data are input thereto. FIG. 14 illustrates a configuration example of a memory system when the seed data s has 2 bits. The encoding processing circuit 300 includes redundant encoding circuits 331 to 334 and a biased selector 335. The redundant encoding circuits 331 to 334 receives 00, 01, 10, and 11 as the seed data s, respectively, and scramble n-bit input data Din to output (n+2)-bit data maintaining information on the seed data s.

The biased selector 335 selects one of the output data of the redundant encoding circuits 301 to 304, which has fewer bits which are subject to read disturbance of the memory 320, and outputs the selected output data to the memory 320.

The decoding circuit 310 reads the (n+2)-bit data from the memory 320 and decodes the data to output n-bit data Dout while discarding the 2-bit seed data.

As described above, by performing redundant processing while adding 1-bit or more seed data to the input data, selecting data having fewer bits which are subject to read disturbance, and writing the selected data to the memory, it is possible to decrease the read disturbance probability.

Moreover, since the decoding circuit 310 just decodes the data read from the memory 320 and output the decoding results while discarding the seed data, it is possible to suppress an increase in the access time.

(Fourth Embodiment)

Figures 15, 16:
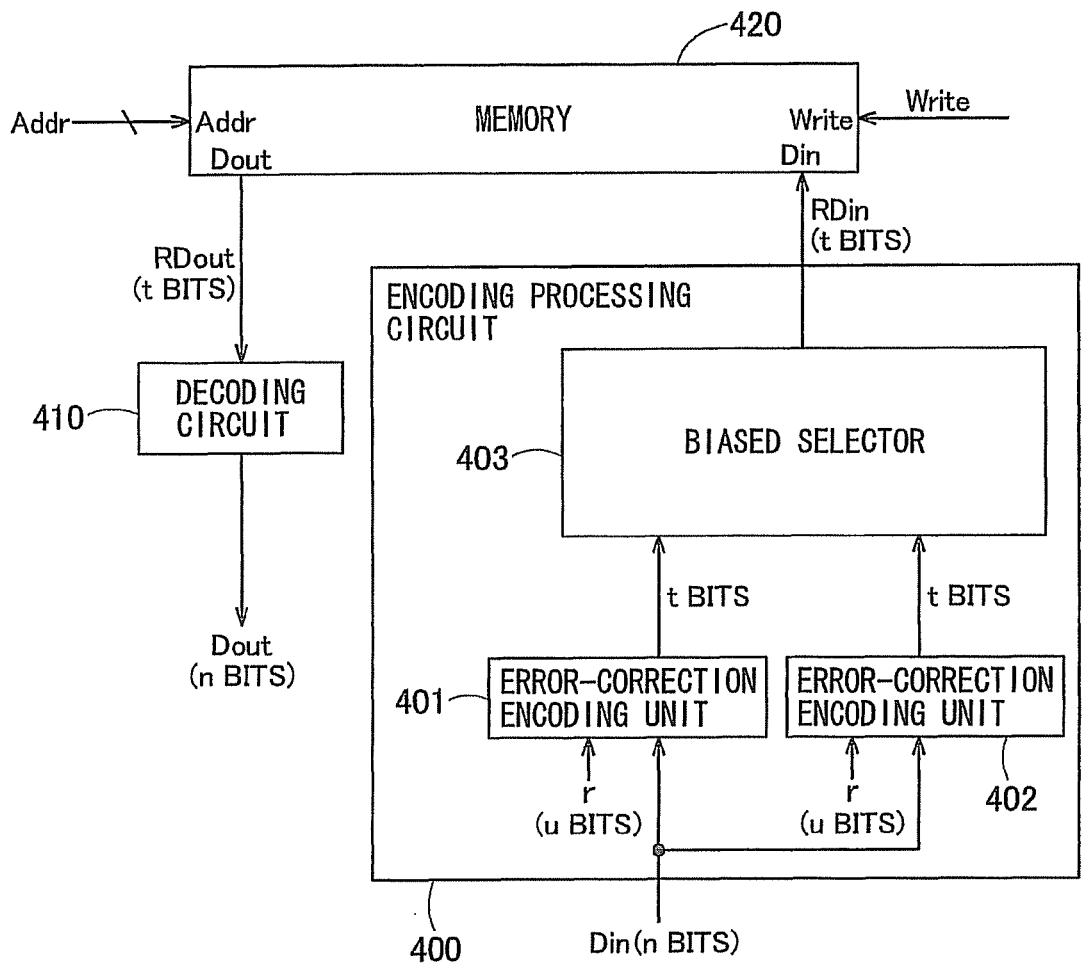
FIG. 15 is a schematic configuration diagram of a memory system according to a fourth embodiment of the invention.
FIG. 16 is a diagram illustrating an example of a generation matrix used for a Hamming encoding process.

FIG. 15 illustrates a schematic configuration of a memory system according to a fourth embodiment of the invention. The memory system includes an encoding processing circuit 400, a decoding circuit 410, and a memory 420. The encoding processing circuit 400 includes error-correction encoding units 401 and 402 and a biased selector 403. It is assumed that a memory controller (one equivalent to the memory controller 130 of the first embodiment) which writes data to the memory 420 is included in the memory 420.

The error-correction encoding units 401 and 402 perform an error-correction encoding process on data in which n-bit input data Din and u-bit data inversion bit r are added to output t-bit data. Here, n, u, and t are integers of 1 or more. The value of the data inversion bit r is different from the error-correction encoding unit 401 to the error-correction encoding unit 402.

The output data of the error-correction encoding unit 401 and the output data of the error-correction encoding unit 402 have a relation such that all or most bits thereof are inverted.

The biased selector 403 selects one of the output data of the error-correction encoding units 401 and 402, which has fewer bits which are subject to read disturbance of the memory 420, and outputs the selected output data to the memory 420.

The decoding circuit 410 reads the t-bit data from the memory 420, performs decoding and error-correction on the read data to generate (n+u)-bit data and outputs n-bit data Dout excluding the u-bit data inversion bit r.

Figures 17, 18:
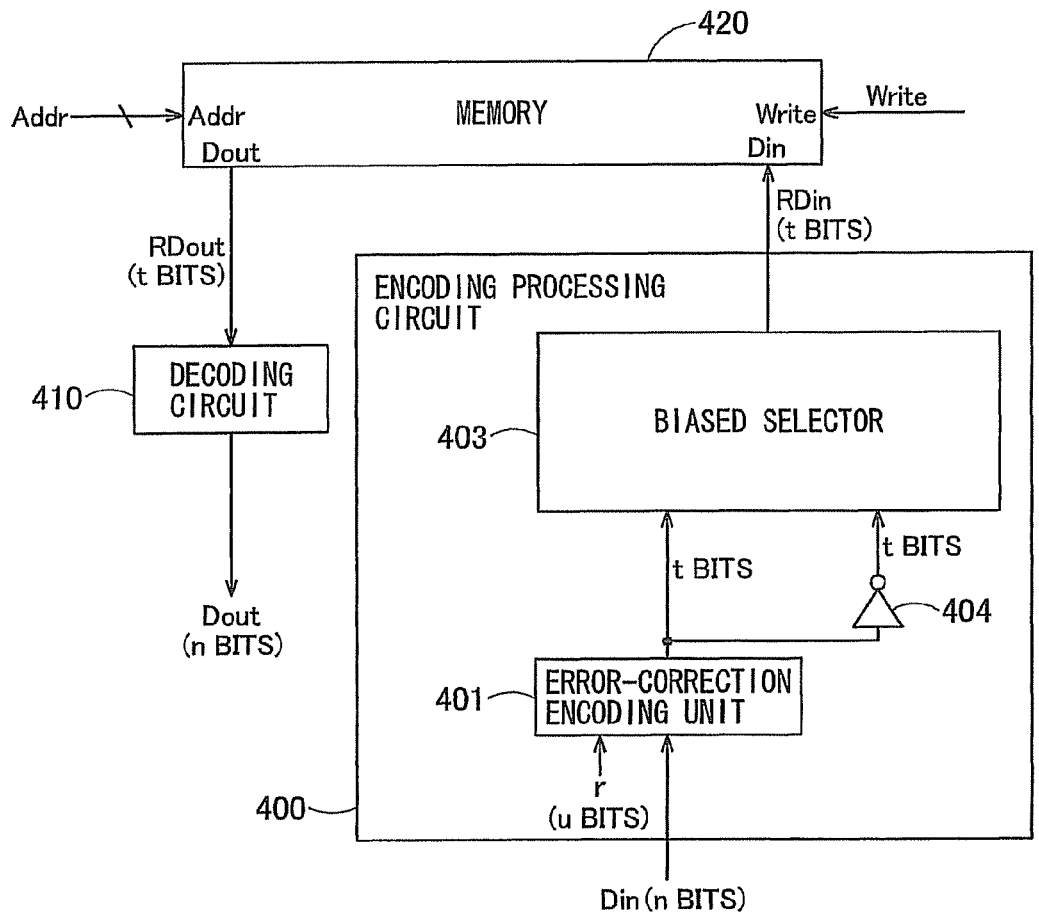
FIG. 17 is a mathematical expression illustrating an example of the Hamming encoding process.
FIG. 18 is a schematic configuration diagram of a memory system according to a modification.

For example, when n=7 and the data inversion bit r has one bit, the error-correction encoding units 401 and 402 perform a Hamming encoding process as the error-correction encoding process as illustrated in FIG. 17 using a Hamming code having a generation matrix as illustrated in FIG. 16. In this case, the output data has 12 bits.

All bits on the eighth row of the generation matrix corresponding to the data inversion bit r are 1. Therefore, the output data when the data inversion bit r is 0 becomes one in which the respective bits of the output data when the data inversion bit r is 1 are inverted. Accordingly, the output data of the error-correction encoding unit 401 becomes one in which the respective bits of the output data of the error-correction encoding unit 402 are inverted.

The biased selector 403 selects one of the output data of the error-correction encoding units 401 and 402, which has fewer bits which are subject to read disturbance of the memory 420, and outputs the selected output data to the memory 420. The biased selector 403 may have the same configuration as the biased selector 303 illustrated in FIG. 12.

Moreover, as illustrated in FIG. 18, an inverter circuit 404 that inverts the output of the error-correction encoding unit 401 may be provided without providing the error-correction encoding unit 402 to the encoding processing circuit 400. This is because the output of the inverter circuit 404 becomes identical to the output of the error-correction encoding unit 402. The biased selector 403 may select one of the output data of the error-correction encoding unit 401 and the inverter circuit 404, which has fewer bits which are subject to read disturbance of the memory 420, and output the selected output data to the memory 420.

Figures 19, 20, 21:
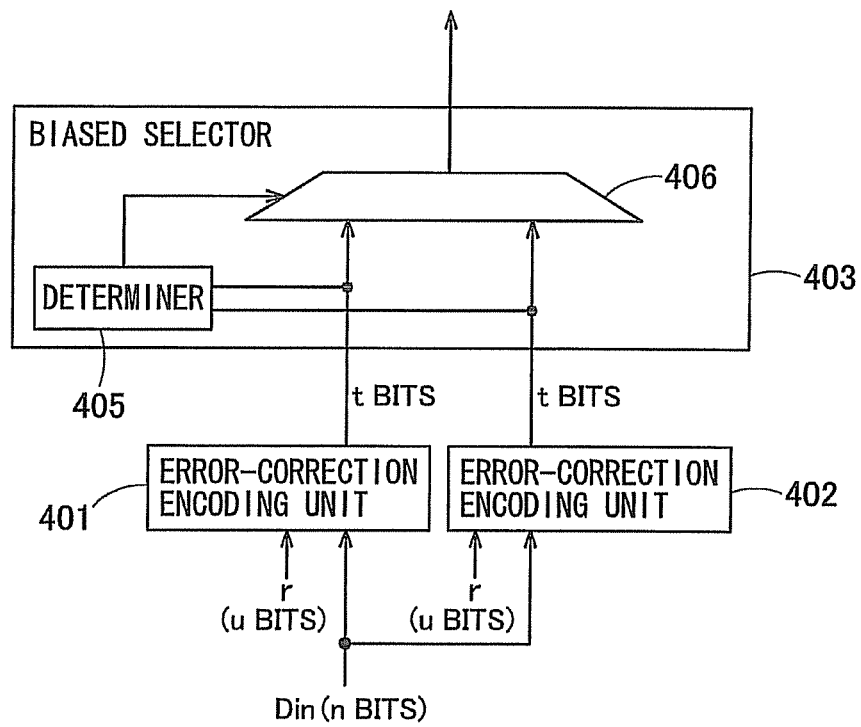
FIG. 19 is a diagram illustrating an example of a checking matrix.
FIG. 20 is a diagram illustrating an example of a generation matrix used for a Hamming encoding process.
FIG. 21 is a schematic configuration diagram of a biased selector according to a modification.

The decoding circuit 410 reads 12-bit data from the memory 420, performs decoding and error-correction on the read data using a checking matrix as illustrated in FIG. 19, and restores and outputs the original 7-bit data while discarding the data inversion bit r.

When n=8 and the data inversion bit r has one bit, the error-correction encoding units 401 and 402 performs a Hamming encoding process as the error-correction encoding process using a Hamming code having a generation matrix as illustrated in FIG. 20. In this case, the output data has 13 bits.

As understood from FIG. 20, a 0-bit is included in the ninth row of the generation matrix corresponding to the data inversion bit r. Therefore, the output data when the data inversion bit r is 0 does not become one in which the respective bits of the output data when the data inversion bit r is 1 are inverted. Accordingly, the output data of the error-correction encoding unit 401 does not become one in which the respective bits of the output data of the error-correction encoding unit 402 are inverted.

However, since 12 bits among the 13 bits are inverted, the biased selector 403 selects one of the output data of the error-correction encoding units 401 and 402, which has fewer bits which are subject to read disturbance of the memory 420, and outputs the selected output data to the memory 420, so that the read disturbance probability can be decreased.

The biased selector 403 may be configured as illustrated in FIG. 21. A determiner 405 monitors the output data of the error-correction encoding units 401 and 402 and outputs a selection signal to a selector 406 so as to select the output data which has fewer bits which are subject to read disturbance of the memory 420.

Figure 22:
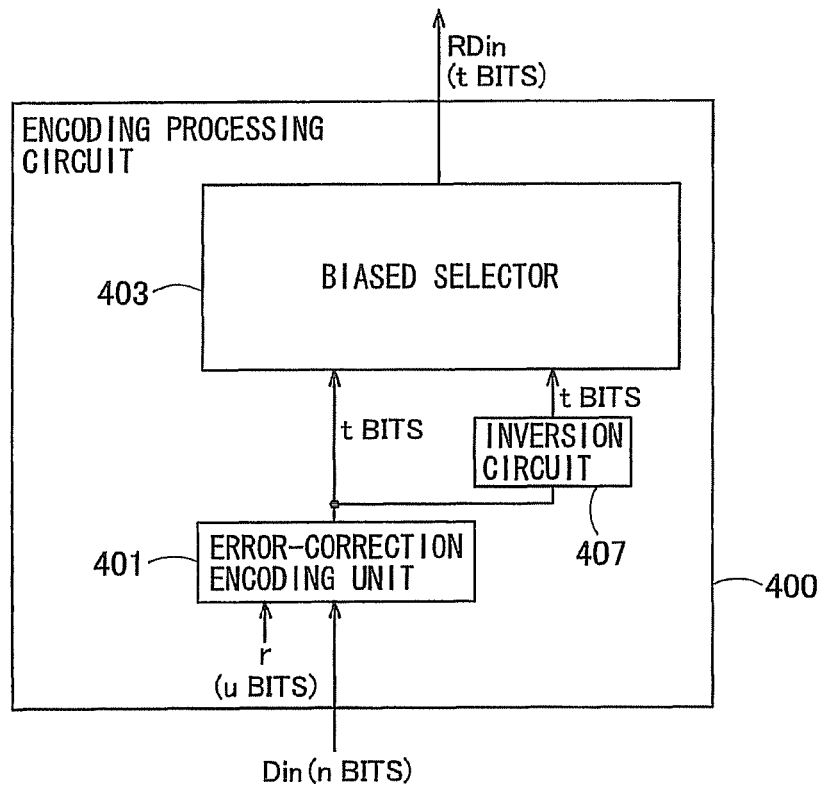
FIG. 22 is a schematic configuration diagram of an encoding processing circuit according to a modification.

In the case of the generation matrix as illustrated in FIG. 20, the positions at which the bits of the output data are inverted by the data inversion bit r are known in advance. In this case, the encoding processing circuit 400 may be configured as illustrated in FIG. 22. In this case, an inversion circuit 407 inverts only bits which are inverted by the data inversion bit r and outputs the inversion results. Moreover, the determiner 405 of the biased selector 403 determines which one of the data generated by the error-correction encoding unit 401 and the data generated by the inversion circuit 407 has fewer bits which are subject to read disturbance with respect to only the bits which are inverted by the data inversion bit r. With such a configuration, it is possible to omit the error-correction encoding unit 402.

As described above, by performing the error correction encoding process while adding mutually different data inversion bits to the input data, selecting one of a plurality of error correction encoding data having fewer bits which are subject to read disturbance, and writing the selected data to the memory, it is possible to decrease the read disturbance probability.

Moreover, since the decoding circuit just performs decoding and error-correction on the data read from the memory and output the decoding results while discarding the data inversion bit, it is possible to suppress an increase in the memory access time.

(Fifth Embodiment)

Figure 23:
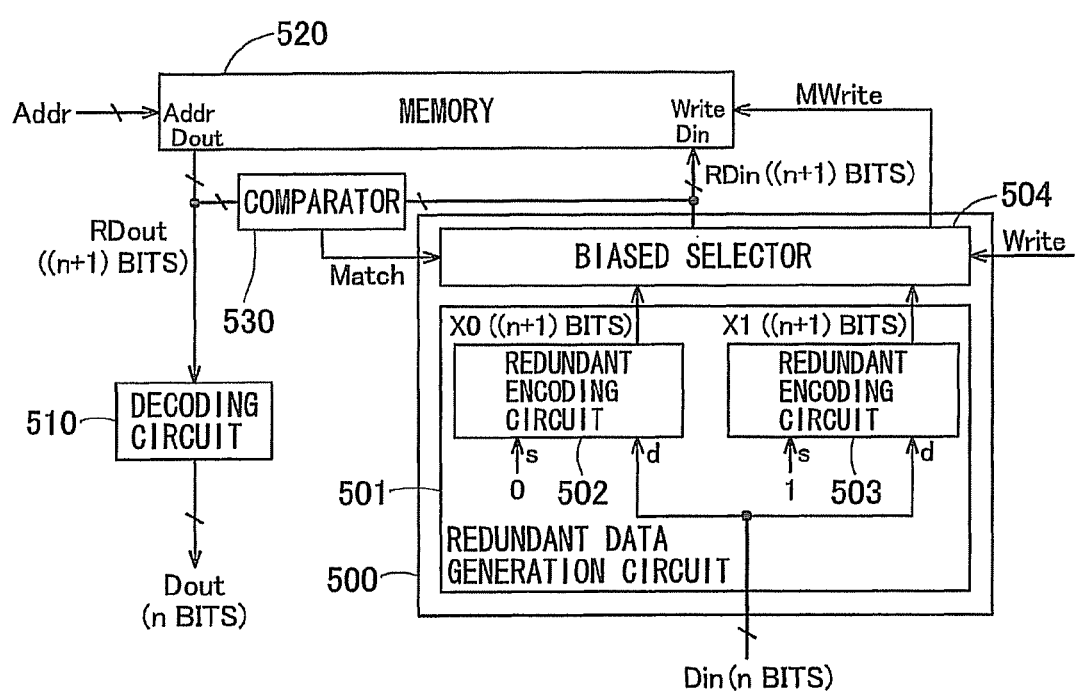
FIG. 23 is a schematic configuration diagram of a memory system according to a fifth embodiment of the invention.

FIG. 23 illustrates a schematic configuration of a memory system according to a fifth embodiment of the invention. The memory system includes an encoding processing circuit 500, a decoding circuit 510, a memory 520, and a comparator 530. It is assumed that a memory controller (one equivalent to the memory controller 130 of the first embodiment) which writes data to the memory 520 is included in the memory 520.

The encoding processing circuit 500 includes a redundant data generation circuit 501 and a biased selector 504. The redundant data generation circuit 501 receives n-bit input data Din (n is an integer of 1 or more) and outputs mutually different (n+1)-bit redundant data X0 and X1.

The redundant data generation circuit 501 includes redundant encoding circuits 502 and 503. The redundant encoding circuit 502 receives the input data Din and 0 as 1-bit seed data s and performs a redundant encoding process on the data to output (n+1)-bit redundant data X0.

The redundant encoding circuit 503 receives the input data Din and 1 as 1-bit seed data s and performs a redundant encoding process on the data to output (n+1)-bit redundant data X1.

The redundant encoding circuits 502 and 503 are configured by a logical circuit as illustrated in FIG. 13, for example.

The biased selector 504 selects one of the redundant data X0 and X1 having fewer bits which are subject to read disturbance of the memory 520, and outputs the selected data to the memory 520 as writing data RDin. The biased selector 504 receives a write signal Write indicating a write timing and outputs a write signal MWrite to the memory 520 in response to output of data to the memory 520.

A memory controller (not illustrated) writes the data RDin output from the biased selector 504 to the address of the memory 520 designated by an address signal Addr based on the write signal MWrite.

The decoding circuit 510 reads the (n+1)-bit data RDout from the memory 520 and performs a decoding process on the data to output n-bit data Dout while discarding the information on the seed data s. The decoding circuit 510 is configured to be capable of outputting the data Din when any one of the data X0 and X1 is input thereto.

The comparator 530 reads data from the same address immediately after the data are written to the memory 520, compares the data written to the memory 520 and the data read from the memory 520, and outputs a comparison result signal Match indicating the comparison result to the biased selector 504.

Among the memory cells abundant in the memory 520, failed memory cells which always output 1 or 0 constantly coexist in a certain ratio. Due to the influence of the failed memory cells, the comparison result of the comparator 530 indicates that the two data are not identical. For example, when there are failed cells in which data of which the value of a certain value is 1 is written, and memory cells corresponding to this bit always output 0 constantly, the value of that bit of the read data changes to 0, and the comparison result of the comparator 530 indicates that the two data are not identical.

When the comparison result signal Match indicates that the two data are not identical, the biased selector 504 selects one of the redundant data X0 and X1 having more bits which are subject to read disturbance of the memory 520 and outputs the selected data to the memory 520.

The redundant data X0 and X1 have a relation such that all or most bits thereof are inverted. Therefore, when any one of the redundant data X0 and X1 are written to the memory 520, and the read data and the written data are not identical to each other, it can be expected that if the other of the redundant data X0 and X1 are written, the read data and the written data will be identical to each other.

For example, when the redundant encoding circuits 502 and 503 are configured by the logical circuit as illustrated in FIG. 13 and the input data is 01100011, the redundant data X0 becomes 001000010 and the redundant data X1 becomes 110111101. When the value which is subject to read disturbance of the memory 520 is 1, the biased selector selects the redundant data X0 which are data having fewer 1-bits (more 0-bits). When the redundant data X0 is written to the memory 520 and the read value is 001000011, the comparison result signal Match output from the comparator 530 indicates that the two data are not identical.

In this case, the biased selector selects data other than the redundant data X0, namely the redundant data X1. Although the memory cells of the memory 520 corresponding to the lowermost bits are fixed to 1, since the lowermost bit of the redundant data X1 is 1, correct data is maintained by the memory 520. As a result, it is possible to correctly restore the original value by the decoding circuit 510.

Therefore, even when there are failed memory cells in the memory 520, by selecting the data correctly maintained in the memory 520, it is possible to correct the failed memory cells.

The memory system of the present embodiment connects to hardware such as a microprocessor to write and read data.

Figure 24:
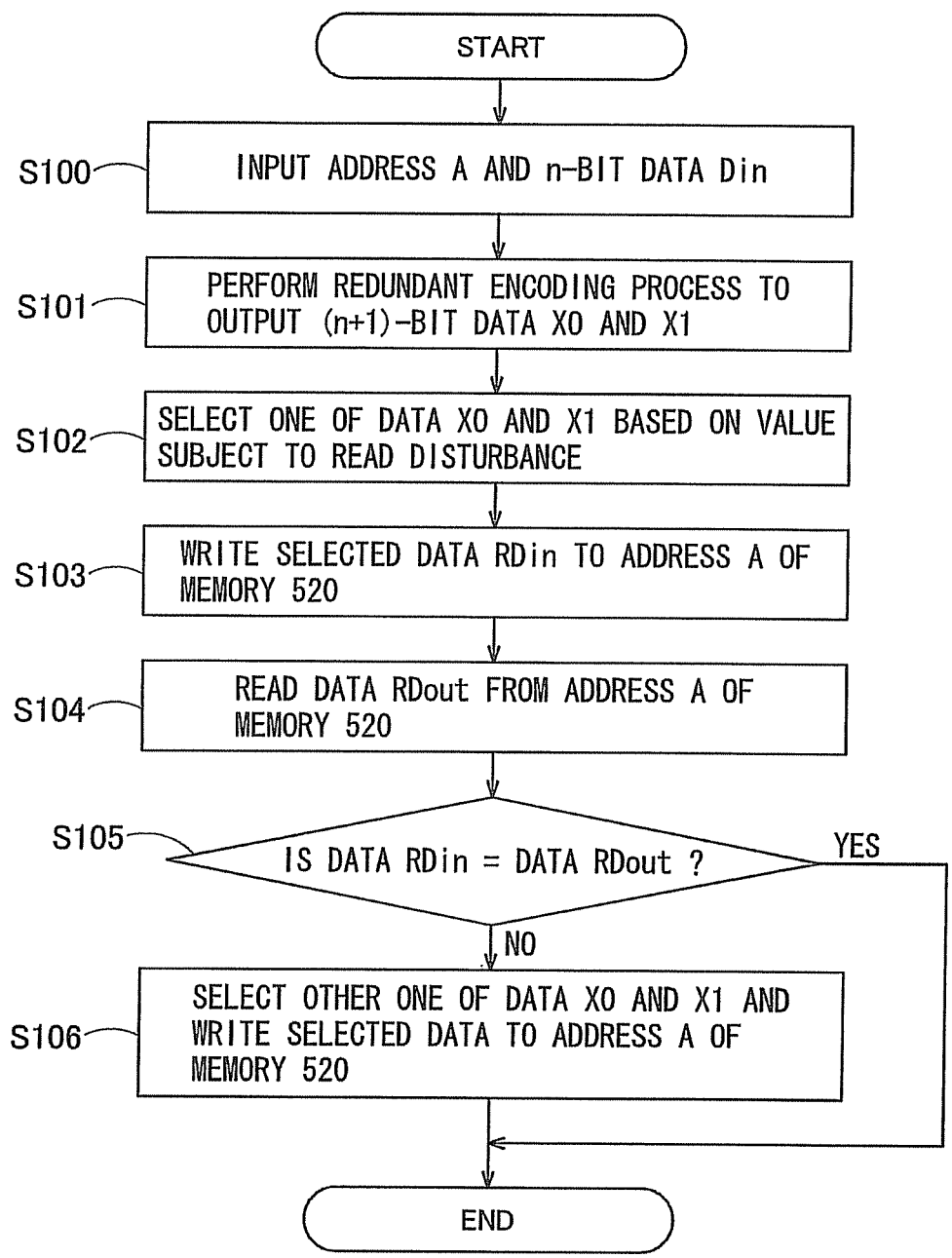
FIG. 24 is a flowchart of a data writing method according to the fifth embodiment.

A data writing method using the memory system will be described with reference to the flowchart illustrated in FIG. 24.

In this example, although a case in which a microprocessor (including a processor in the memory controller) writes data in a memory is described, the same is applied to a case in which a hardware other than the microprocessor writes data. In order to write data to a memory system, the microprocessor outputs a destination address to be written to an address signal Addr of the memory system and outputs target data to be written to a data signal Din of the memory system. Moreover, the microprocessor starts a write operation by changing the output logical value to the write signal Write of the memory system from 0 to 1.

(Step S100)

An address A serving as a data writing destination is input from the microprocessor to the memory 520 by way of an address signal Addr. Moreover, n-bit data Din is input from the microprocessor to the redundant encoding circuit 1.

(Step S101)

The redundant data generation circuit 501 performs a redundant encoding process to output (n+1)-bit redundant data X0 and X1.

(Step S102)

The biased selector 504 selects one of the redundant data X0 and X1 based on the value which is subject to read disturbance of the memory 520. One having fewer bits which are subject to read disturbance is selected.

(Step S103)

The biased selector 504 outputs the data selected in step S102 to the memory 520 as writing data RDin. In addition, the biased selector 504 changes the logical value of the write signal MWrite to the memory 520 from 0 to 1 to instruct to write data to the memory 520, whereby the data RDin is written to the address A of the memory 520.

(Step S104)

The data RDout is read from the address A of the memory 520.

(Step S105)

The comparator 5 compares the data RDin and the data RDout and outputs a comparison result signal Match indicating the comparison result. If the comparison result signal Match is true, namely the data RDin and the data RDout are identical to each other, it is determined that data is correctly written to the memory 520, and the write operation ends.

If the comparison result signal Match is false, namely the data RDin and the data RDout are not identical, the flow proceeds to step S106.

(Step S106)

The biased selector 504 selects one of the redundant data X0 and X1 which was not selected in step S102 and writes the selected data to the address A of the memory 520.

Figure 25:
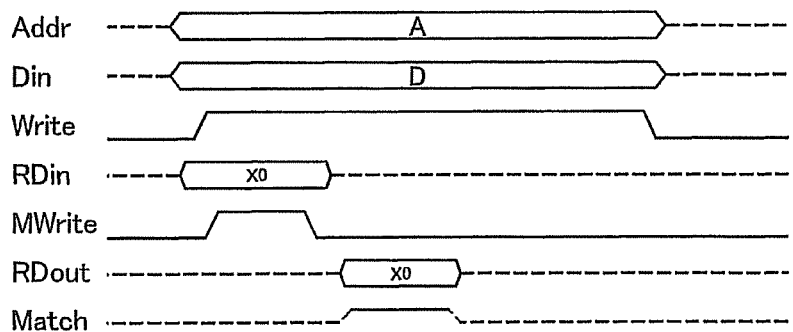
FIG. 25 is an example of a timing chart of the data writing method according to the fifth embodiment.
Figure 26:
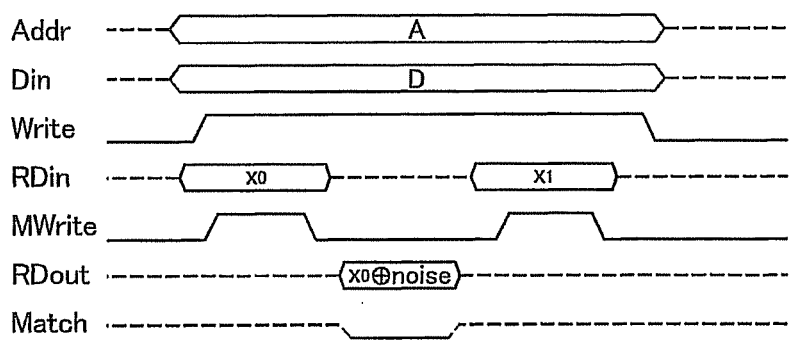
FIG. 26 is an example of a timing chart of the data writing method according to the fifth embodiment.

FIG. 25 illustrates the timing chart when the comparison result in step S105 indicates that the two data are identical, and FIG. 26 illustrates the timing chart when the comparison result indicates that the two data are not identical.

Figure 27:
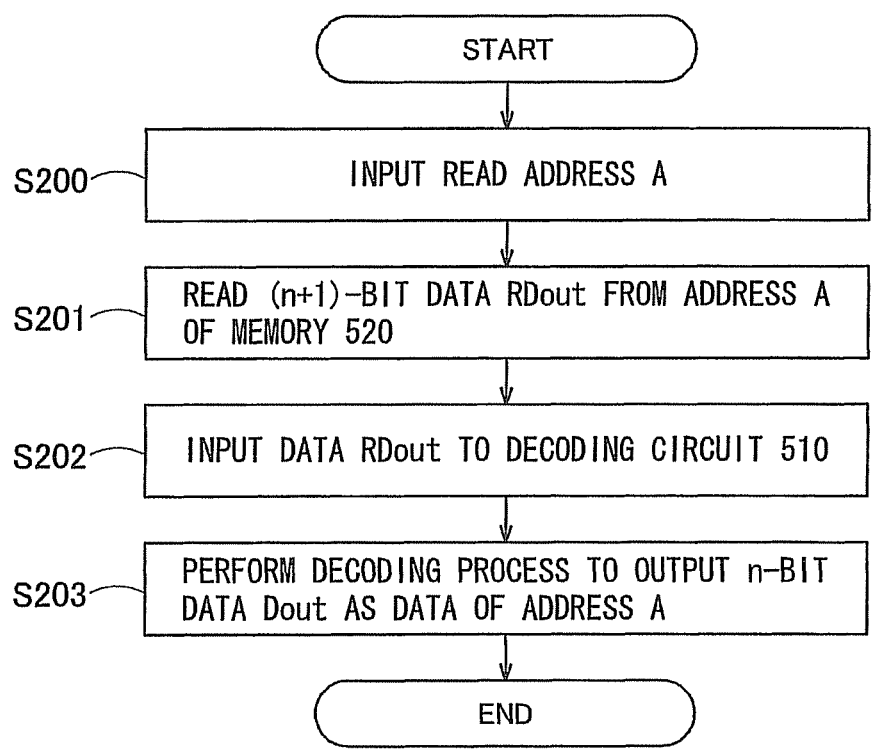
FIG. 27 is a flowchart of a data reading method according to the fifth embodiment.

Next, a data reading method will be described with reference to the flowchart illustrated in FIG. 27. In order to read data from the memory system, the microprocessor outputs a destination address to be read to an address signal Addr of the memory system to thereby start a read operation of the memory system.

(Step S200)

An address A is input from the microprocessor by way of the address signal Addr.

(Step S201)

The (n+1)-bit data RDout is read from the address A of the memory 520.

(Step S202)

The data RDout is input to the decoding circuit 520.

(Step S203)

A decoding process is performed, and n-bit data Dout is output as data of the address A of the memory 520.

As described above, first, the redundant data having fewer bits which are subject to read disturbance of the memory 520 is selected and written. If the comparison result of the comparator 530 indicates that data is not correctly written due to failure or the like of memory cells, the other redundant data is selected and written. By doing so, the failed memory cells are corrected while decreasing the read disturbance probability.

In FIG. 23, although the redundant data generation circuit 501 outputs two redundant data X0 and X1 while adding 1-bit seed data s to the input data, three or more redundant data may be output.

Figure 28:
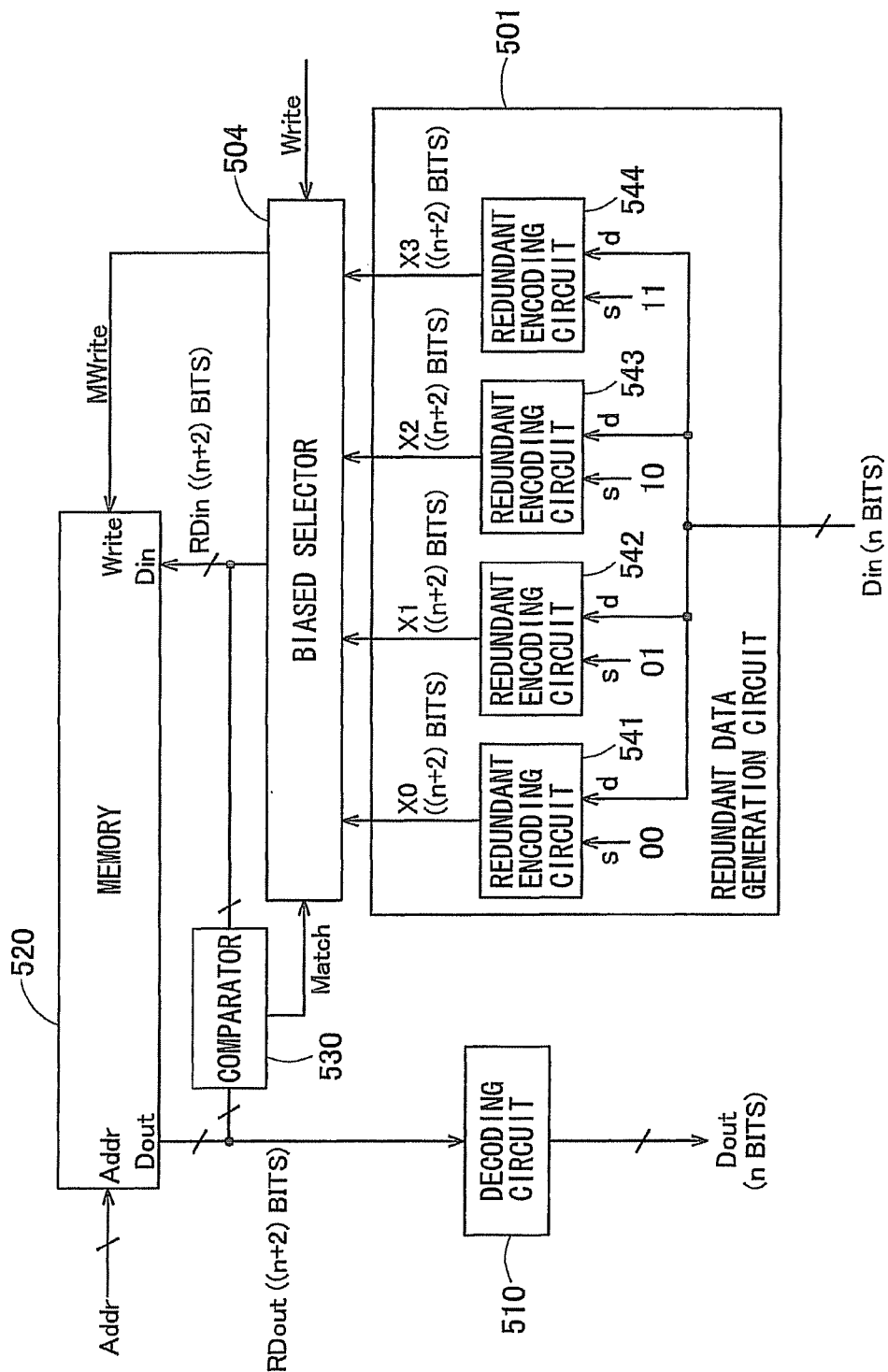
FIG. 28 is a schematic configuration diagram of a memory system according to a modification.

FIG. 28 illustrates a configuration example in which the redundant data generation circuit 501 outputs four redundant data X0 to X3 while adding 2-bit seed data s. The redundant data generation circuit 501 includes redundant encoding circuits 541 to 544. Each of the redundant encoding circuits 541 to 544 outputs (n+2)-bit redundant data X0 to X3 while adding 00, 01, 10, and 11 to n-bit input data Din as 2-bit seed data s.

When the input data Din has 6 bits, the redundant encoding circuits 541 to 544 performs a redundant encoding process using a redundant code generation matrix as illustrated in FIG. 29 to output 8-bit redundant data.

When the input data Din is 101100, the redundant data X0, X1, X2, and X3 become 11011100, 00101011, 01110110, and 10001001, respectively. When the value which is subject to read disturbance of the memory 520 is 1, the biased selector 504 selects the redundant data X3 having the smallest number of bits having the value 1.

When the value which is read from the same address by the comparator 530 after the redundant data X3 is written to the memory 520 is not identical to the redundant data X3, the biased selector 504 selects the redundant data X1 having the second smallest number of bits having the value 1. The biased selector selects the redundant data sequentially until the comparison result of the comparator 530 indicates that the two data are identical.

Moreover, if the data read after writing the redundant data X3 was 10001000, it is estimated that a failure wherein the memory cells corresponding to the lowermost bit are fixed to 0 has occurred. In this case, the redundant data X1 of which the lowermost bit is not 0 as well as the redundant data X3 may be excluded from the selection candidates of the biased selector 504 so that the biased selector 504 selects one of the redundant data X0 and X2. In this way, it is possible to shorten the time required for writing data to the memory 520.

Moreover, when the biased selector 504 selects the last one redundant data, the comparison by the comparator 530 after the writing may be omitted by expecting that data has been correctly written.

As described above, the memory cells of the present embodiment can decrease the read disturbance probability and correct failed memory cells. Moreover, the decoding circuit can obtain the original data by performing a predetermined decoding process on data read from the memory regardless of which redundant data is selected by the biased selector. Thus, it is possible to suppress an increase in the memory access time.

The first to fifth embodiments have focused on a difference in the read disturbance probability depending on the values 0 and 1 of the memory cells in order to decrease the read disturbance probability. However, the invention is not limited to a case where the memory cells have only two sates but can be applied to all performances which change depending on the storage state of the memory cells.

The invention is not exactly limited to the above embodiments, and constituent elements can be modified and implemented upon practice without departing from the spirit of the invention. Various inventions can be formed by properly combining a plurality of constituent elements disclosed in the above embodiments. For example, several constituent elements may be omitted from all the constituent elements described in the embodiments. In addition, constituent elements throughout different embodiments may be properly combined.

DESCRIPTION OF REFERENCE NUMERALS

100: encoding processing circuit
110: decoding circuit
120: memory
130: memory controller

What is claimed is:

1. A memory access device comprising:
an encoding processing circuit configured to perform redundant encoding process on target data to be written to thereby generate data which are written to a memory, the number of bits having a predetermined value in the data being half or less than half of the total number of bits;
wherein the encoding processing circuit includes:
a plurality of error-correction encoding units configured to generate 1-bit or more inversion bits to be added to the target data to be written, and perform an error-correction encoding process on data in which the target data to be written and the 1-bit or more inversion bits are added using a predetermined generation matrix to thereby generate error-correction encoding data, the 1-bit or more inversion bits being different from each other among the plurality of error-correction encoding units; and
a biased selector configured to select error-correction encoding data, the number of bits having the predetermined value in the selected error-correction encoding data being smallest among the error-correction encoding data generated by the plurality of error-correction encoding units, and
wherein the error-correction encoding data selected by the biased selector are written to the memory.

2. The device according to claim 1, further comprising:
a decoding circuit configured to perform decoding and error-correction on the data read from the memory using a checking matrix corresponding to the generation matrix, and outputs the decoding results to the outside of the memory system while discarding the inversion bit portions.

3. A memory access device comprising:
an encoding processing circuit configured to perform redundant encoding process on target data to be written to thereby generate data which are written to a memory, the number of bits having a predetermined value in the data being half or less than the total number of bits; and a comparator configured to compare the data read from the memory and the data generated by the encoding processing circuit, wherein the encoding processing circuit includes:

a plurality of redundant encoding circuits configured to perform redundant encoding process on data in which the n-bit target data, where n is an integer of 1 or more, and seed data are added, to thereby generate (n+m)-bit redundant data, where m is an integer of 1 or more, the seed data being different from each other among the plurality of redundant encoding circuits; and a biased selector configured to select the redundant data generated by the redundant encoding circuit in the ascending order of the number of bits having the predetermined value and determines the redundant data being selected when the comparison result by the comparator indicates the comparison target data are identical as data to be written to the memory.

4. The device according to claim 3, further comprising:

a decoding circuit configured to decode any one of the plurality of redundant data to thereby generate the data in which the target data to be written and the seed data are added, wherein the decoding circuit reads (n+m)-bit data from the memory, performs a decoding process on the data, and outputs the decoding results to the outside of the memory system while discarding the seed data portions.

5. A memory access device writing an error-correction encoding data to a memory, wherein the error-correction encoding data to be written to the memory has fewer bits which are subject to read disturbance among a plurality of the error-correction encoding data obtained by performing an error-correction encoding process on data in which a target data to be written and 1-bit or more data inversion bits are added, the 1-bit or more data inversion bits being different from each other.

* * * * *